(12) United States Patent
Böhm et al.

(10) Patent No.: US 6,459,626 B1
(45) Date of Patent: Oct. 1, 2002

(54) INTEGRATED MEMORY HAVING MEMORY CELLS AND REFERENCE CELLS, AND CORRESPONDING OPERATING METHOD

(75) Inventors: Thomas Böhm, Zorneding; Georg Braun, München, both of (DE); Heinz Hönigschmid, East Fishkill, NY (US); Zoltan Manyoki, Kanata (CA); Thomas Röhr, Yokohama (JP)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/962,703

(22) Filed: Sep. 24, 2001

Related U.S. Application Data

(63) Continuation of application No. PCT/DE00/00758, filed on Mar. 10, 2000.

(30) Foreign Application Priority Data

Mar. 23, 1999 (DE) .......................................... 199 13 109

(51) Int. Cl.[7] .................................................. G11C 7/00
(52) U.S. Cl. .................... 365/189.07; 365/145; 365/210
(58) Field of Search ................................. 365/145, 207, 365/210, 189.07, 185.2, 214

(56) References Cited

U.S. PATENT DOCUMENTS

| | | | | |
|---|---|---|---|---|
| 4,873,664 A | * | 10/1989 | Eaton, Jr. .................... | 365/145 |
| 5,010,518 A | * | 4/1991 | Toda ............................ | 365/145 |
| 5,572,459 A | | 11/1996 | Wilson et al. | |
| 5,828,615 A | | 10/1998 | Mukunoki et al. | |
| 5,844,832 A | | 12/1998 | Kim | |
| 6,137,712 A | * | 10/2000 | Rohr et al. .................. | 365/145 |
| 6,349,053 B1 | * | 2/2002 | Daughton et al. ........... | 365/145 |

FOREIGN PATENT DOCUMENTS

| | | |
|---|---|---|
| EP | 0 049 630 A2 | 4/1982 |
| EP | 0 365 002 A2 | 4/1990 |
| EP | 1 001 430 A2 | 5/2000 |

* cited by examiner

*Primary Examiner*—David Nelms
*Assistant Examiner*—Gene N. Auduong
(74) *Attorney, Agent, or Firm*—Laurence A. Greenberg; Werner H. Stemer; Gregory L. Mayback

(57) ABSTRACT

An integrated memory has two first switching elements, which respectively connect a bit line of a first bit line pair to a bit line of a second bit line pair. In addition, the integrated memory has two second switching elements, which respectively connect one of the reference cells of one bit line pair to that bit line of the other bit line pair which is not connected via the corresponding first switching element to the bit line assigned to this reference cell. Information is written back to the reference cells via the sense amplifiers. A method of operating the integrated memory is also provided.

5 Claims, 3 Drawing Sheets

INTEGRATED MEMORY HAVING MEMORY CELLS AND REFERENCE CELLS, AND CORRESPONDING OPERATING METHOD

CROSS-REFERENCE TO RELATED APPLICATION

This application is a continuation of copending International Application No. PCT/DE00/00758, filed Mar. 10, 2000, which designated the United States.

BACKGROUND OF THE INVENTION

Field of the Invention

The invention relates to an integrated memory having memory cells and reference cells, and to an operating method for such a memory.

Memory devices of this type are described for example in U.S. Pat. Nos. 5,572,459 and 5,844,832. The memory devices described therein are of the FRAM (ferroelectric random access memory) type. These are ferroelectric memories, which are constructed similarly to DRAMs (Dynamic Random Access Memory) but whose storage capacitor has a ferroelectric dielectric. A differential sense amplifier is assigned to a respective bit line pair. A read access is effected simultaneously to a respective memory cell of two bit line pairs. A reference potential is generated on the respective other bit line of each bit line pair, the reference potential lying between two supply potentials of the memory. Each sense amplifier amplifies the differential signal present at its terminals, and thus the data read from the memory cells.

The reference potential is generated in the following way: firstly, the content of a reference cell is read out onto that bit line of each bit line pair which is not connected to the memory cell that is currently to be read out. In this case, a high logic level is stored in the reference cell of one bit line pair and a low logic level is stored in the reference cell of the other bit line pair. Afterward, the two bit lines onto which the content of the reference cells has been read out are short-circuited together. In this way, a reference potential is established on these two bit lines, the reference potential approximately corresponding to the average value of the two potentials previously generated on the bit lines.

In order to generate the reference potential, then, it is important that in each case different potentials are stored beforehand in the two reference cells. For this purpose, the two U.S. patents mentioned above provide special devices which cause the different potentials to be written to the reference cells.

SUMMARY OF THE INVENTION

It is accordingly an object of the invention to provide an integrated memory configuration and a method of operating an integrated memory configuration which overcome the above-mentioned disadvantages of the heretofore-known memory devices and methods of operating such memory devices of this general type and with which the generation of two different potentials in reference cells of two bit line pairs is effected utilizing components that are already present.

With the foregoing and other objects in view there is provided, in accordance with the invention, an integrated memory configuration, including:

a plurality of word lines;

four reference word lines;

bit lines including two bit line pairs;

memory cells provided at crossover points between each of the word lines with a respective one of the bit lines of each of the two bit line pairs;

reference cells provided at crossover points between each of the four reference word lines and a respective one of the bit lines;

two differential sense amplifiers connected to a respective one of the two bit line pairs;

two first switching elements connecting a respective one of the bit lines of a first one of the two bit line pairs to a respective one of the bit lines of a second one of the two bit line pairs; and two second switching elements respectively connecting one of the reference cells of one of the two bit line pairs to a given one of the bit lines of another one of the two bit line pairs, the given one of the bit lines of the another one of the two bit line pairs not being connected, via a corresponding one of the two first switching elements, to one of the bit lines assigned to the one of the reference cells of the one of the two bit line pairs.

In other words, the memory according to the invention has word lines, at least four reference word lines and two pairs of bit lines. Furthermore, it has memory cells, which are provided at crossover points of each word line with a respective bit line of each bit line pair. Furthermore, it has reference cells, which are provided at crossover points of each reference word line with one of the bit lines. Two differential sense amplifiers are connected to a respective one of the bit line pairs. The memory has two first switching elements, which respectively connect a bit line of the first pair to a bit line of the second pair, and also two second switching elements, which respectively connect one of the reference cells of one bit line pair to that bit line of the other pair which is not connected via the corresponding first switching element to the bit line assigned to this reference cell.

In this case, the first switching elements serve for short-circuiting the bit lines connected to them, in order to generate a reference potential, required for the evaluation of a differential signal by the sense amplifiers, in the manner described above with reference to U.S. Pat. Nos. 5,572,459 and 5,844,832. The second switching elements serve for writing back suitable potentials to the reference cells again after an evaluation carried out by the sense amplifiers, or after amplification of the differential signal present at the sense amplifiers. The second switching elements make it possible for this writing-back to be carried out through the use of the sense amplifiers that are present anyway.

The invention is therefore preferably suitable for use in integrated memories with reference cells whose content is destroyed during read-out and which therefore has to be re-established after read-out. Memories of this type are DRAMs and FRAMs, for example. The second switching elements make it possible, during this writing-back, to connect both previously read-out reference cells to the same sense amplifier. Since each activated sense amplifier generates mutually complementary potentials at its terminals, this ensures that mutually complementary potentials are written to the two reference cells.

If writing-back of potentials to the reference cells through the use of the sense amplifiers were provided without the second switching elements being present, these potentials would be dependent on the datum of the normal memory cell that had previously been read out by the sense amplifier.

Therefore, it would then be possible for the same potential to be written to both reference cells, for which a common short-circuit element in the form of the first switching element is provided. This is not permissible, however, since, as explained previously, different potentials must be written to these two reference cells for the generation of the desired reference potential.

Due to the fact that the sense amplifiers can be used for writing information items to the reference cells on the basis of the presence of the second switching elements, the two different potentials (logic "1" and logic "0") are fed to the reference cells in the same way as corresponding data to be written are fed to the normal memory cells. Since the information to be written is supplied by the sense amplifier in both cases, the described generation of the reference potential takes place in a way which is adapted to the operation of writing to the normal memory cells.

According to another feature of the invention, the reference cells have a selection switching element, whose control terminal is connected to the corresponding reference word line and whose first terminal of its controllable path is connected to the corresponding bit line, and, in those two reference cells which are connected via the second switching elements to a bit line of the other pair, the second terminal of the controllable path of their selection switching element is connected to the corresponding second switching element.

According to yet another feature of the invention, the second switching elements have control terminals connected to different control lines in each case.

According to another feature of the invention, the second switching elements have control terminals connected to a common control line.

With the objects of the invention in view there is also provided, a method of operating an integrated memory configuration, the method includes the following steps:

providing an integrated memory configuration having memory cells, reference cells and two bit line pairs connected to respective differential sense amplifiers;

reading out a first one of the reference cells onto a bit line of a first one of the two bit line pairs and reading out a second one of the reference cells onto a bit line of a second one of the two bit line pairs;

short-circuiting the bit line of the first one of the two bit line pairs and the bit line of the second one of the two bit line pairs;

reading out given ones of the memory cells onto respective other bit lines of the two bit line pairs;

amplifying, with the differential sense amplifiers, differential signals established on the two bit line pairs;

decoupling a given reference cell selected from the group consisting of the first one of the reference cells and the second one of the reference cells, after having been read out, from a corresponding one of the differential sense amplifiers connected to a bit line associated with the given reference cell;

connecting the given reference cell, after having been decoupled, to a given bit line of a corresponding other one of the two bit line pairs, the given bit line having previously not been short-circuited with a bit line assigned to the given reference cell; and simultaneously writing back a differential signal amplified by one of the differential sense amplifiers to one of the given ones of the memory cells having been read out and to the first one and the second one of the reference cells having been read out, and writing back a further differential signal amplified by another one of the differential sense amplifiers to another one of the given ones of the memory cells having been read out.

In other words, in accordance with the operating method according to the invention, in the event of a read access, what takes place is a simultaneous read-out of a respective normal memory cell on each bit line pair. Afterward, one of the second switching elements brings about the situation where the two reference cells previously read out are connected to the same sense amplifier. The differential signal amplified by this sense amplifier is then written back simultaneously to one of the read-out memory cells and to the two read-out reference cells connected to it, and the reference signal amplified by the other sense amplifier is written back to the other read-out memory cell. The writing-back to the memory cells and reference cells advantageously takes place relatively rapidly on account of the simultaneity.

Other features which are considered as characteristic for the invention are set forth in the appended claims.

Although the invention is illustrated and described herein as embodied in an integrated memory having memory cells and reference cells, and a corresponding operating method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
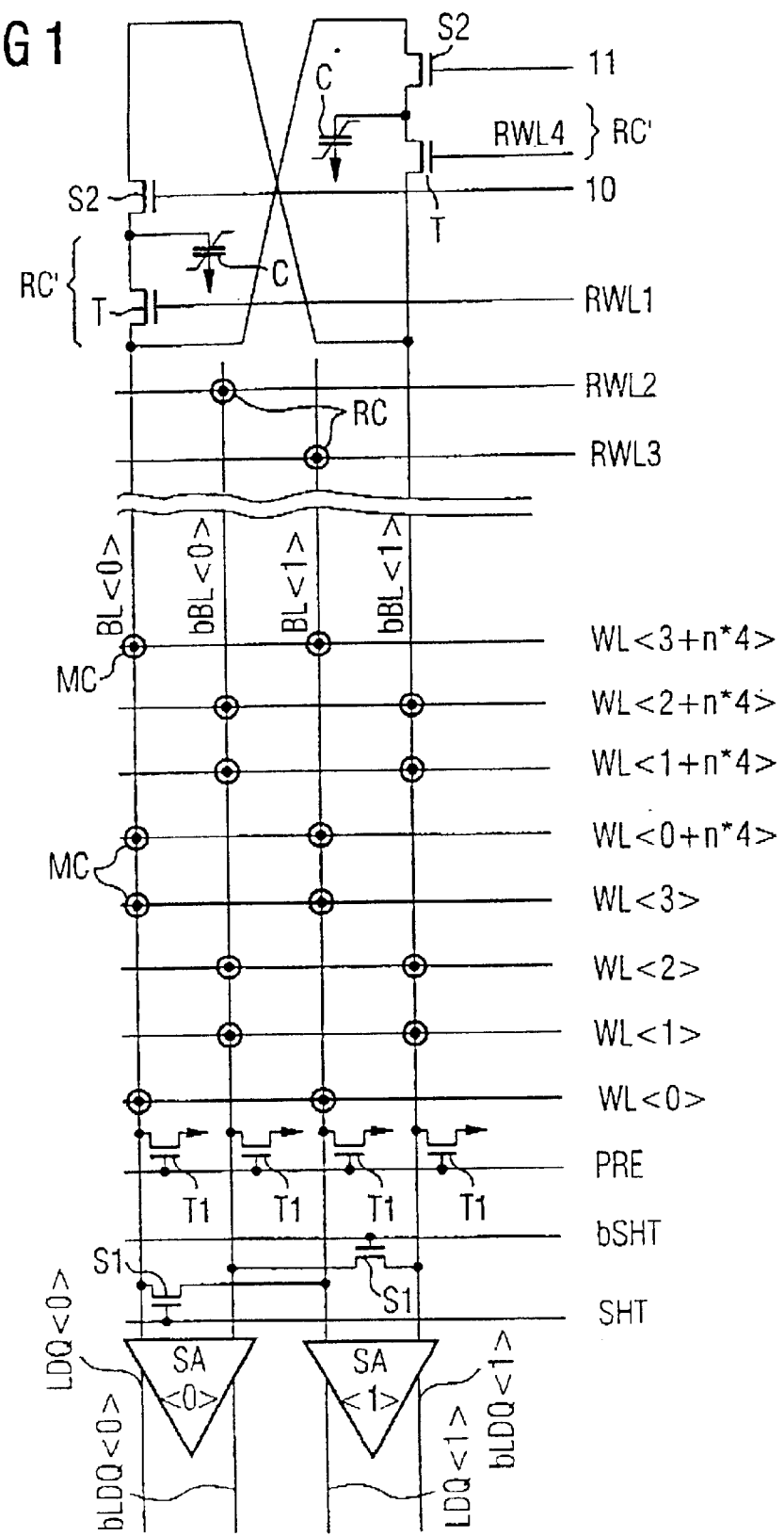
FIG. 1 is a schematic circuit diagram of a first exemplary embodiment of the integrated memory according to the invention.

Referring now to the figures of the drawings in detail and first, particularly, to FIG. 1 thereof, there is shown an integrated memory according to the invention in the form of an FRAM. This memory has bit lines BLi, bBLi, word lines WLi and reference word lines RWLi. Furthermore, it has memory cells MC, which are provided at crossover points of the bit lines with the word lines WLi. It also has reference cells RC, which are provided at crossover points of the bit lines with the reference word lines RWLi. Of the numerous bit lines BLi, bBLi of the memory, only two bit line pairs are illustrated in FIG. 1. Each bit line pair is assigned a sense amplifier SAi, which serves for amplifying a differential signal present on the respective bit line pair and forwards the signal in amplified form on data lines LDQi, bLDQi. Each bit line is connected via a transistor T1 to a fixed potential which serves for precharging the bit lines in the event of a read access to one of the memory cells that is to be performed. Control terminals of the transistors T1 are connected to a precharge line PRE.

Figure 2:
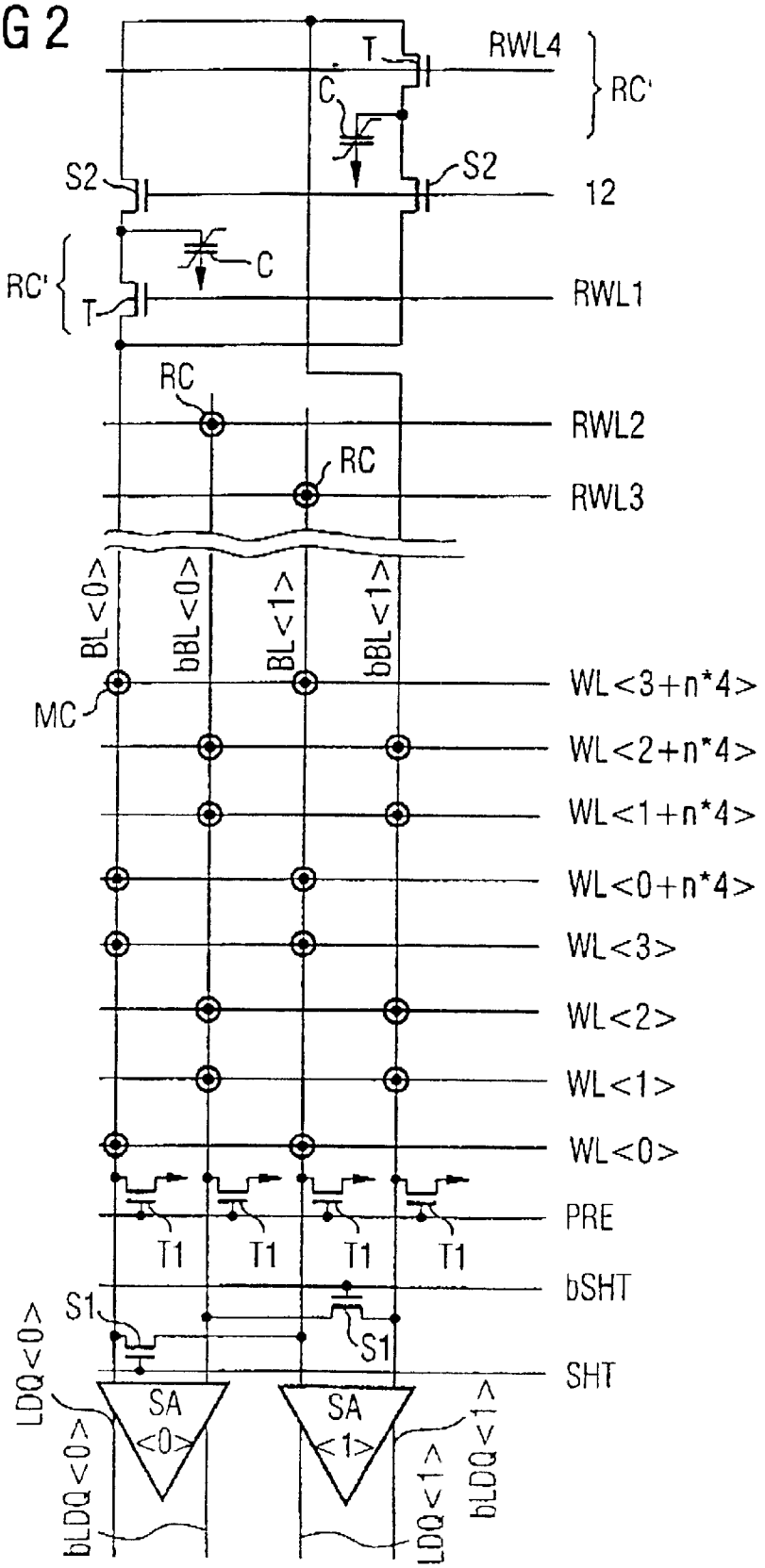
FIG. 2 is a schematic circuit diagram of a second exemplary embodiment of the integrated memory according to the invention.
Figure 3:
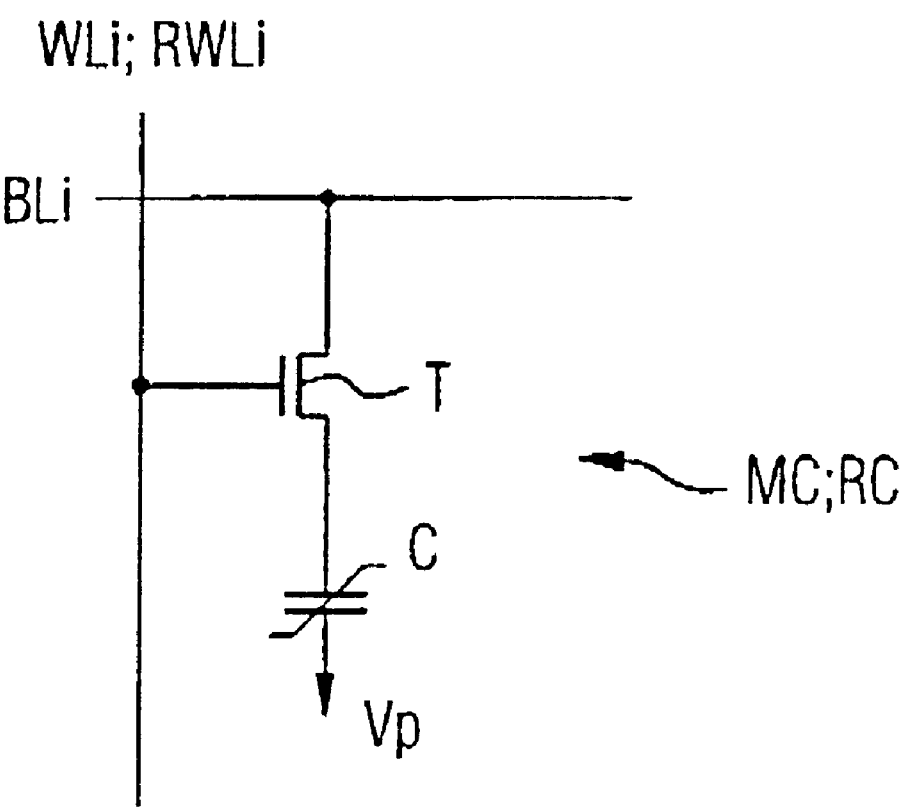
FIG. 3 is a schematic circuit diagram of an exemplary embodiment of a memory cell and of a reference cell of the memories illustrated in FIGS. 1 and 2.

In FIGS. 1 and 2, the memory cells MC and two of the reference cells RC are only indicated symbolically by circles, while two other reference cells RC' have been illustrated in their entirety in the figures. The memory cells MC and reference cells RC that are only depicted symbolically each have the construction illustrated in FIG. 3. Memory cells of the 1-transistor/1-capacitor type are involved, which each have a selection transistor T and a storage capacitor C with a ferroelectric dielectric. The selection transistor T connects one electrode of the storage capacitor C to one of the bit lines BLi, while a control terminal of the selection transistor T is connected to one of the word lines WLi or reference word lines RWLi. The second electrode of the storage capacitor is connected to a plate potential $V_p$.

The two reference cells RC' explicitly illustrated in the upper region of FIG. 1 are constructed in exactly the same way as the memory cells MC and the other reference cells RC. Thus, they likewise have a selection transistor T and a storage capacitor C of the type just explained with reference to FIG. 3. However, the reference cells RC' differ from the other cells MC, RC in that that electrode of the storage capacitor C which is connected to the respective selection transistor T is connected via a respective second switching element S2 to one of the bit lines of the respective other bit line pair.

A control terminal of the second switching element S2 on the left in FIG. 1 is connected to a first control line 10 and a control terminal of the right-hand second switching element S2 is connected to a second control line 11.

The memory illustrated in FIG. 1 furthermore has two first switching elements S1, via which a respective bit line of the two bit line pairs are connected to one another. As will be explained below, the first switching elements S1 serve for short-circuiting the bit lines connected to them in order to generate a reference potential.

At its control terminal, the left-hand first switching element S1 in FIG. 1 is connected to a first short-circuit line SHT, and the right-hand first switching element S1 is connected to a second short-circuit line bSHT.

In FIG. 1—counting from left to right—the first bit line BL0 is connected to the third bit line BL1 and the second bit line bBL0 is connected to the fourth bit line bBL1 via a respective one of the first switching elements S1. The reference cell RC' assigned to the first bit line BL0 is connected via its second switching element S2 to the fourth bit line bBL1. The reference cell RC' connected to the fourth bit line bBL1 via its selection transistor T is connected via its second switching element S2 to the first bit line BL0. Thus, the second switching elements S2 in each case connect the reference cell RC' assigned to them to that bit line of the respective other bit line pair to which the bit line assigned to this reference cell RC' is not also simultaneously connected via one of the first switching elements S1.

The first and second switching elements S1, S2 and also the transistors T1 and also the selection transistors T are n-channel transistors in the exemplary embodiments considered here.

Although, in the exemplary embodiments explained here, the bit line pairs are arranged according to the "folded bit line concept", which enables a particularly simple configuration of the second switching elements S2, other exemplary embodiments are possible in which the bit line pairs are arranged according to the "open bit line concept".

A read access to the memory illustrated in FIG. 1 is explained below: firstly, the four bit lines are precharged to the fixed potential by the precharge line PRE momentarily turning the transistors T1 on. Afterward, through the use of a word line decoder (not illustrated), one of the word lines WLi is brought to a high level, while the rest of the word lines remain at a low level. By way of example, the word line WL0 is activated. As a result, the selection transistor T of the two memory cells MC connected to this word line WL0 is opened and thus conductively connects the associated storage capacitor C to the respective bit line BL0, BL1. At the same time, via the second reference word line RWL2 and the fourth reference word line RWL4, in each case that reference cell RC, RC' which is connected to one of the other two bit lines bBL0, bBL1 is selected. As a result, from these two reference cells, the information stored therein is read out onto the two bit lines bBL0 and bBL1. This presupposes that opposite logic states (logic "0" and logic "1") are stored in these two reference cells to be read out. These information items were written to the reference cells either during initialization of the memory or at the end of a read access— already carried out beforehand—to the memory cells MC in the way that will be explained in even more detail further below, via the sense amplifiers SAi.

The two bit lines bBLi which are connected to the reference cells RC, RC' to be read out and have different potentials after the read-out are then short-circuited via the first switching element S1 provided between them by the second short-circuit line bSHT temporarily assuming a high level. The first short-circuit line SHT continually maintains a low level in the event of an access to memory cells MC which are connected to the bit lines BL0 and BL1. The two bit lines bBL1 which are short-circuited via the right-hand first switching element S1 assume, as a result of charge balancing, a potential which approximately corresponds to the arithmetic mean of the two potentials which they had previously. This average value is the reference potential required for proper functioning of the sense amplifiers. The first switching element S1 is then turned off again via the second short-circuit line bSTH. Afterward, the two sense amplifiers SAi are activated, which thereupon amplify the differential signals situated on the bit line pair connected to them and forward them to the data lines LDQi, bLDQi. In this case, before the sense amplifiers are activated, the previously generated reference potential is present at a respective input of the sense amplifiers. The sense amplifiers SAi amplify the differential signals present to full supply levels.

Since FRAMs are memories in which the memory cell content is destroyed in the event of a read access, the information read from the memory cells MC must be written back again to the memory cells. Moreover, the information read from the reference cells RC, RC' must also be re-established. For this purpose, at the end of the read access to the two memory cells MC connected to the word line WL0, the second reference word line RWL2 is left at a high potential, while the fourth reference word line RWL4 is brought to low potential. At the same time, the second control line 11 is brought to a high potential (the first reference word line RWL1, the third reference word line RWL3 and the first control line 10 continually remain at low level in the event of this read access). In this way, the reference cell RC' illustrated on the right in FIG. 1 is electrically isolated from the fourth bit line bBL1 and electrically connected to the first bit line BL0.

Since the word line WL0 also still has a high level, the left-hand terminal of the first sense amplifier SA0 is then simultaneously electrically connected to the memory cell MC just read out and to the right-hand reference cell RC'. The right-hand terminal of the sense amplifier SA0 is electrically conductively connected to the reference cell RC connected to the second reference word line RWL2. The left-hand terminal of the second sense amplifier SA1 is electrically conductively connected to the other memory cell MC just read out, while the right-hand terminal of the second sense amplifier SA1 is electrically conductively connected to none of the memory cells MC or reference cells RC, RC'. Consequently, the information items or differential signals just read out from the memory cells MC and amplified by the sense amplifiers SAi are simultaneously written back to both memory cells MC read out during this read access and to the two read-out reference cells RC, RC'. In this case, the first sense amplifier SA0 simultaneously writes information items to three cells, namely the left-hand memory cell MC on the first bit line BL0 and to the two reference cells RC, RC', which are assigned the reference word lines RWL2 and RWL4. The second sense amplifier SA1 merely writes back to the memory cell MC which is connected to the third bit line BL1 and was previously read out the information read from the memory cell and amplified.

In the manner described, it is ensured that, after the end of the read access, opposite potentials are always stored in the reference cells RC, RC' connected via a common first switching element S1. Consequently, in the event of a subsequent, renewed read access, the reference potential can again be generated in the manner already described.

The first switching element S1 illustrated on the left in FIG. 1 and the first control line 10 and also the second switching element S2 connected to the latter serve in an equivalent manner for generating the reference potential and for writing back information items to the other two reference cells RC, RC', which are assigned the first reference word line RWL1 and the third reference word line RWL3, if memory cells MC which are connected to the second bit line bBL0 and the fourth bit line bBL1 are intended to be read out.

Deviating from what is shown in FIG. 1, it is also possible for the first switching elements S1 to be provided not at those ends of the bit lines BLi, bBLi which face the sense amplifiers SAi but at the opposite ends thereof, at which the reference cells RC, RC' are also provided. The first switching elements S1 can, in particular, also connect together the electrode—connected to the respective selection transistor T—of the storage capacitors C of the reference cells RC, RC' connected to the corresponding bit line, instead of being provided directly between the corresponding bit lines, as shown in FIG. 1.

FIG. 2 shows a variant of the exemplary embodiment illustrated in FIG. 1. It corresponds for the most part to the exemplary embodiment in construction and function, so that only the differences between FIG. 2 and FIG. 1 are discussed below. The difference principally lies in the fact that, at their control terminals, the two second switching elements S2 are connected to a common control line 12, so that they can only be simultaneously turned on or turned off, i.e. switched to be conducting or non-conducting.

The first part of a read access in the case of the memory illustrated in FIG. 2 takes place in exactly the same way as in that from FIG. 1. There are differences only in the second part of a read access, namely when information items are written back to the reference cells. This is because, in the case of the memory in accordance with FIG. 2, information is simultaneously written back to all four reference cells RC, RC' irrespective of which memory cells MC were previously accessed. For this purpose, during the writing-back, in addition to the respective word line WLi, the second reference word line RWL2, the third reference word line RWL3 and the control line 12 are always simultaneously at a high level, while the first reference word line RWL1 and the fourth reference word line RWL4 have a low level. The consequence of this is that the two terminals of the first sense amplifier SA0 are connected to the reference cell RC' assigned to the fourth reference word line RWL4, and to the reference cell RC assigned to the second reference word line RWL2, and the terminals of the second sense amplifier SA1 are connected to the reference cell RC assigned to the third reference word line RWL3, and to the reference cell RC' assigned to the first reference word line RWL1.

Consequently, the information amplified by each sense amplifier is simultaneously written to the memory cell MC just read out and to a respective pair of the reference cells RC, RC'. In this case, complementary information items or levels are respectively written to the two cells of each of these reference cell pairs. Consequently, at the end of a read access, mutually complementary levels are stored in the reference cells RC, RC' whose bit lines are connected to one another via one of the first switching elements S1.

The exemplary embodiment illustrated in FIG. 2 has the advantage over that from FIG. 1 that only one control line 12 is required, instead of two control lines 10 and 11, and that the writing back to the reference cells RC, RC' always takes place in the same way, irrespective of the position of the memory cells MC to be read out in each case. In return, all four reference cells must be accessed during the writing-back, even though only two of them are required in each case for the actual read-out.

We claim:

1. An integrated memory configuration, comprising:
   a plurality of word lines;
   four reference word lines;
   bit lines including two bit line pairs;
   memory cells provided at crossover points between each of said word lines with a respective one of said bit lines of each of said two bit line pairs;
   reference cells provided at crossover points between each of said four reference word lines and a respective one of said bit lines;
   two differential sense amplifiers connected to a respective one of said two bit line pairs;
   two first switching elements connecting a respective one of said bit lines of a first one of said two bit line pairs to a respective one of said bit lines of a second one of said two bit line pairs; and
   two second switching elements respectively connecting one of said reference cells of one of said two bit line pairs to a given one of said bit lines of another one of said two bit line pairs, said given one of said bit lines of said another one of said two bit line pairs not being connected, via a corresponding one of said two first switching elements, to one of said bit lines assigned to said one of said reference cells of said one of said two bit line pairs.

2. The integrated memory according to claim 1, wherein:
   each of said reference cells has a selection switching element including a control terminal and a controllable path with a first terminal and a second terminal;
   said control terminal is connected to a corresponding one of said four reference word lines;
   said first terminal of said controllable path is connected to a corresponding one of said bit lines; and
   said second terminal of said controllable path of said selection switching element of those two of said reference cells, which are connected via said two second switching elements to a respective one of said bit lines of said another one of said two bit line pairs, is connected to a corresponding one of said two second switching elements.

3. The integrated memory configuration according to claim 1, including:

control lines; and said two second switching elements having control terminals connected to respective different ones of said control lines.

4. The integrated memory configuration according to claim 1, including:

a common control line; and said two second switching elements having control terminals connected to said common control line.

5. A method of operating an integrated memory configuration, the method which comprises:

providing an integrated memory configuration having memory cells, reference cells and two bit line pairs connected to respective differential sense amplifiers;

reading out a first one of the reference cells onto a bit line of a first one of the two bit line pairs and reading out a second one of the reference cells onto a bit line of a second one of the two bit line pairs;

short-circuiting the bit line of the first one of the two bit line pairs and the bit line of the second one of the two bit line pairs;

reading out given ones of the memory cells onto respective other bit lines of the two bit line pairs;

amplifying, with the differential sense amplifiers, differential signals established on the two bit line pairs;

decoupling a given reference cell selected from the group consisting of the first one of the reference cells and the second one of the reference cells, after having been read out, from a corresponding one of the differential sense amplifiers connected to a bit line associated with the given reference cell;

connecting the given reference cell, after having been decoupled, to a given bit line of a corresponding other one of the two bit line pairs, the given bit line having previously not been short-circuited with a bit line assigned to the given reference cell; and simultaneously writing back a differential signal amplified by one of the differential sense amplifiers to one of the given ones of the memory cells having been read out and to the first one and the second one of the reference cells having been read out, and writing back a further differential signal amplified by another one of the differential sense amplifiers to another one of the given ones of the memory cells having been read out.

* * * * *